(12) United States Patent
Grange et al.

(10) Patent No.: US 8,335,347 B2
(45) Date of Patent: Dec. 18, 2012

(54) SYSTEM FOR OPTICAL RECOGNITION OF THE POSITION AND MOVEMENT OF AN OBJECT ON A POSITIONING DEVICE

(75) Inventors: Matthieu Grange, Chavannes (CH); Arnaud Casagrande, Lignière (CH)

(73) Assignee: The Swatch Group Research and Development Ltd, Marin (CH)

( * ) Notice: Subject to any disclaimer, the term of this patent is extended or adjusted under 35 U.S.C. 154(b) by 1028 days.

(21) Appl. No.: 12/306,308

(22) PCT Filed: Jun. 6, 2007

(86) PCT No.: PCT/EP2007/055609
§ 371 (c)(1),
(2), (4) Date: Dec. 23, 2008

(87) PCT Pub. No.: WO2007/147738
PCT Pub. Date: Dec. 27, 2007

(65) Prior Publication Data
US 2009/0285449 A1    Nov. 19, 2009

(30) Foreign Application Priority Data

Jun. 23, 2006 (EP) .................................... 06115988

(51) Int. Cl.
*G06K 9/00* (2006.01)
(52) U.S. Cl. ...................................................... 382/103
(58) Field of Classification Search .................. None
See application file for complete search history.

(56) References Cited

U.S. PATENT DOCUMENTS

| 3,441,936 A | 4/1969 | Heine |
| 4,764,668 A * | 8/1988 | Hayard .......................... 235/470 |
| 4,901,073 A * | 2/1990 | Kibrick ........................... 341/13 |
| 5,507,605 A | 4/1996 | Bae |
| 6,087,941 A | 7/2000 | Ferraz |
| 6,191,744 B1 | 2/2001 | Snow et al. |

(Continued)

FOREIGN PATENT DOCUMENTS
FR    2 590 681 A1    5/1987
(Continued)

OTHER PUBLICATIONS

Notice of Allowance issued in co-pending related U.S. Appl. No. 12/306,313, dated Jul. 8, 2011.

(Continued)

*Primary Examiner* — Claire X Wang
(74) *Attorney, Agent, or Firm* — Griffin & Szipl, P.C.

(57) ABSTRACT

The optical recognition system determines the position and/or movement of an object (3) on a positioning device (2). The positioning device includes means (20, 21, 22) for driving the object in rotation and/or along a curvilinear or rectilinear path. The optical recognition system includes optical detection means, such as a digital camera (6), for detecting the position or orientation of the object, and a data processing station (7) for data supplied by the detection means. A certain number of different figures or references are distributed over the external surface of the object. The arrangement of each figure on the external surface of the object enables the detection means, associated with the data processing station, to determine the position or orientation of the object on the positioning device. The figures are formed by circular barcodes (10), wherein each circular barcode defines a precise position of the object (3) on the positioning device.

17 Claims, 4 Drawing Sheets

U.S. PATENT DOCUMENTS

| | | |
|---|---|---|
| 6,329,953 B1 | 12/2001 | McKivergan |
| 6,850,851 B1 | 2/2005 | Fourestie et al. |
| 7,035,594 B2 | 4/2006 | Wallace et al. |
| 7,167,133 B2 | 1/2007 | Nagashima |
| 8,047,518 B2 * | 11/2011 | Grange et al. ......... 269/289 MR |
| 2003/0151184 A1 | 8/2003 | Weibe |
| 2005/0176375 A1 | 8/2005 | Bednaz et al. |
| 2006/0000911 A1 * | 1/2006 | Stekel ..................... 235/462.32 |
| 2006/0049595 A1 | 3/2006 | Crigler et al. |
| 2009/0231217 A1 | 9/2009 | Grange et al. |

FOREIGN PATENT DOCUMENTS

| | | |
|---|---|---|
| GB | 1 188 578 | 4/1970 |
| GB | 2 234 877 A | 2/1991 |
| JP | 2003-43083 | 2/2003 |
| WO | 97/25239 | 7/1997 |

OTHER PUBLICATIONS

Notice of Allowance issued in co-pending related U.S. Appl. No. 12/306,300, dated Mar. 31, 2011.

Office Action issued in co-pending related U.S. Appl. No. 12/306,313, dated Apr. 15, 2011.

International Search Report issued in corresponding application No. PCT/EP2007/055609, completed Sep. 14, 2007 and mailed Sep. 21, 2007.

* cited by examiner

Fig. 3A
Fig. 3B
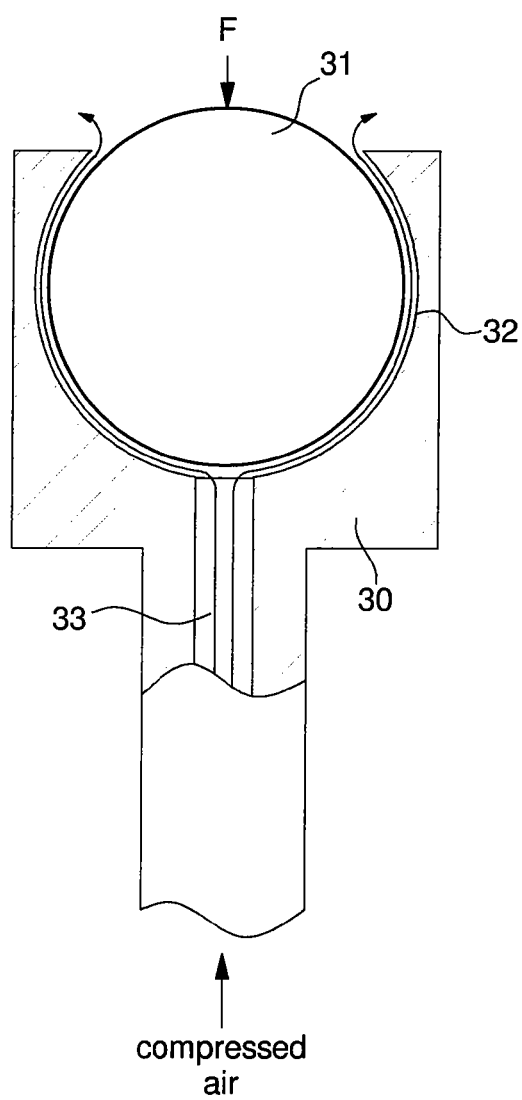
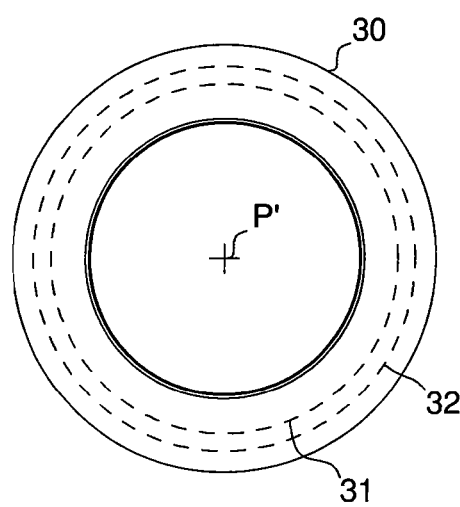

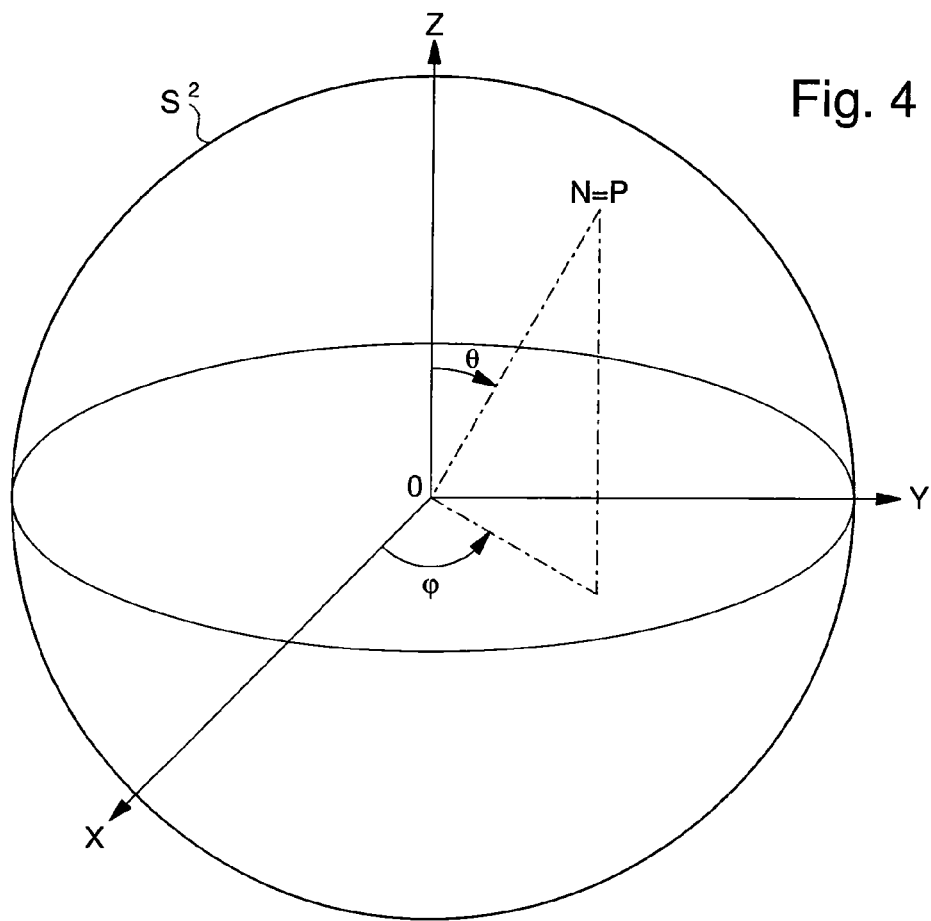
Fig. 4
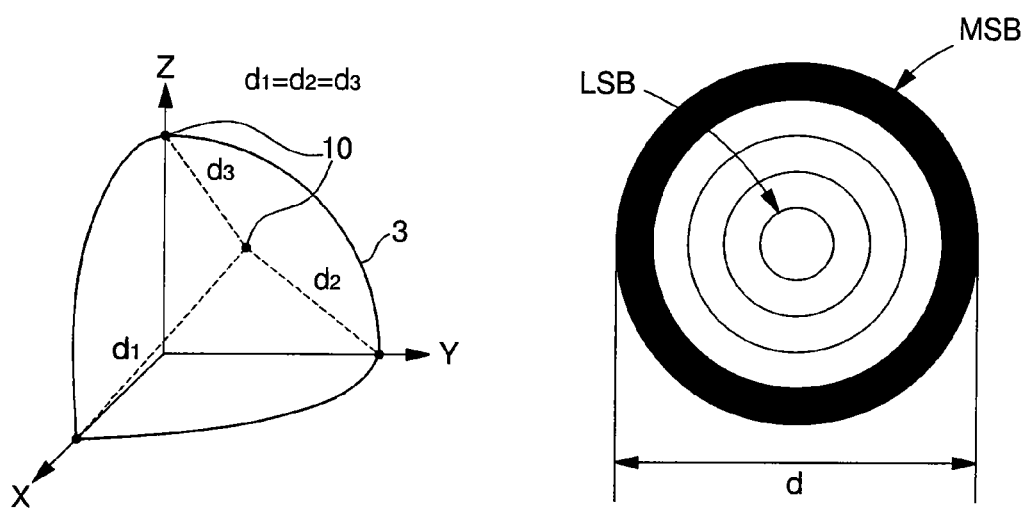
Fig. 5
Fig. 6

SYSTEM FOR OPTICAL RECOGNITION OF THE POSITION AND MOVEMENT OF AN OBJECT ON A POSITIONING DEVICE

This is a National Phase Application in the United States of America. International Patent Application No. PCT/EP2007/055609 filed Jun. 6, 2007, which claims priority of European Patent Application No. 06115988.5, filed Jun. 23, 2006. The entire disclosures of the above patent applications are hereby incorporated by reference.

FIELD OF THE INVENTION

The invention concerns a system for the optical recognition of the position and/or movement of an object on a positioning device. The positioning device includes means for driving the object in rotation and/or along a curvilinear or rectilinear path. The system further includes means for optically detecting the position or orientation of the object, and a data processing station for data supplied by the detection means.

BACKGROUND OF THE INVENTION

For recognising the position and/or orientation of an object, some optical recognition systems can determine mainly the outline of the object on its support, for example on a positioning device. In order to do this, optical detection means, such as a camera, can take at least one image of the outline of the object in order to supply data signals relating to the outline of the object to a data signal processing station. In the processing station, a comparison is made between the detected outline of the object and a stored reference shape, whose position in space is known. On the basis of this comparison, the processing system can then determine a position or orientation of the object on the positioning device.

One drawback of these optical recognition systems essentially lies in the fact that the position or orientation of the object, determined by its outline, is not precise. Moreover, these recognition systems cannot be used if the object is spherical in shape, since the determination of the outline of the object is identical in any position or orientation. These optical recognition systems therefore cannot be used, for example, in systems for measuring the radiation diagram of a transmitting antenna, which is placed in a hollow spherical object, driven in rotation on a positioning device.

FR Patent No. 2 590 681 discloses a system for tracking an object provided with passive target patterns arranged on a spacecraft. The tracking system includes a proximity sensor circuit, which includes a digital imaging device and a light source transmitting light in the direction of the target patterns on the object. The object is swept with a light beam from the light source to allow the imaging device to identify the various positioning target patterns. These target patterns are different from each other and form parallel barcodes of rectangular or trapezoidal shape. There are, for example 4 of these barcodes, distributed at a distance from each other on a flat surface of the object. One drawback of this tracking system is that it does not provide a precise measurement of the position of the object relative to the sensor circuit. Moreover, it can not detect a limited angular orientation of the object on a positioning device.

SUMMARY OF THE INVENTION

It is thus an object of the invention to provide a system that optically recognises the position and/or movement of an object on a positioning device in a precise manner, simple and quick in all angular orientations of the object in order to overcome the drawbacks of the above-cited state of the art.

The invention therefore concerns a system for optical recognition of the position and/or movement of an object on a positioning device, which pertains to a system for optical recognition of the position and/or movement of an object (3) on a positioning device (2), which includes means for driving the object in rotation and/or along a curvilinear or rectilinear path, the system including optical means (6) for detecting the position or orientation of the object, and a data processing station (7) for data supplied by the detection means, a certain number of different figures or references (10) being distributed over the external surface of the object, the arrangement of each figure on the external surface of the object enabling the detection means, associated with the data processing station, to determine the position or orientation of the object on the positioning device, characterized in that the object is a spherical support element for an electronic device (4) and in that the figures or references are formed by circular barcodes (10) which are different from each other, and which are regularly spaced and uniformly distributed on the external surface of the spherical element, each circular barcode defining a precise position of the spherical element (3) on the positioning device.

Particular embodiments of the recognition system are defined in accordance with the second to fourteenth embodiments. In accordance with a second embodiment of the present invention, the first embodiment is modified so that 14 different circular barcodes are distributed at regular intervals over the external surface of the spherical object, each circular barcode, which includes a series of concentric rings, being encoded in 4 bits, wherein the state of each annular bit is defined by a colour that is identical to or different from the colour of the external surface of the spherical element, in addition to an external delimiting bit, which is a different colour from the colour of the external surface of the spherical element to define the edge of each figure. In accordance with a third embodiment of the present invention, the second embodiment is further modified so that the dimension of each circular barcode is close to $1/10^{th}$ of the diameter of the spherical object.

In accordance with a fourth embodiment of the present invention, the first embodiment is modified so that the object is a hollow spherical element, which is formed of two parts that fit one on top of the other to enclose the electronic device. In accordance with a fifth embodiment of the present invention, the first, second, third and fourth embodiments are further modified so that the external surface of the optical recognition system is light-coloured, for example, white, whereas each figure is dark-coloured, for example, black. In accordance with a sixth embodiment of the present invention, the first, second, third, fourth and fifth embodiments are further modified so that the optical detection means of the optical recognition system include a digital camera (6), which is connected to the data processing station (7), and in that the digital camera is a black and white MOS camera with 768× 1024 pixels able to take more than 10 images per second, and preferably 15 images per second.

In accordance with a seventh embodiment of the present invention, the first, second, third, fourth, fifth, and sixth embodiments are further modified so that the optical recognition system includes a lighting device (9) for lighting, in a uniform manner, the external surface of the spherical object that is visible to the optical detection means, such as a digital camera. In accordance with an eighth embodiment of the present invention, the seventh embodiment is modified so that the lighting device of the optical recognition system includes a set of optical fibers (92) guiding light generated by a light source that is distant from the spherical element, to provide a homogenous light beam to improve the image captured by the digital camera of the spherical object, with the various visible figures (10).

In accordance with a ninth embodiment of the present invention, the eighth embodiment is modified so that the set of optical fibers of the optical recognition system is divided into several sub-sets (93) of optical fibers, wherein the ends of the optical fibers of each sub-set in proximity to the spherical element (3) are secured in plastic studs (91) on a lighting structure (90), in that the lighting structure forms a ring, on which several plastic studs (91), for example 6 plastic studs, are arranged for the optical fiber ends of the sub-sets, over the entire periphery of the ring and equidistant from each other, the ring being placed in front of the spherical object on the side of the digital camera (6), without obstructing the digital camera's view of the object, and in that the ends of the optical fibers of each sub-set are oriented so as to direct light beams in the direction of the centre of the spherical object. In accordance with a tenth embodiment of the present invention, the eighth and ninth embodiments are further modified so that the number of optical fibers per sub-set of the optical recognition system is at least two optical fibers, and preferably 6 optical fibers, whose ends, which are secured in one of the plastic studs, which are equidistant from each other, are arranged in the form of equilateral triangles.

In accordance with an eleventh embodiment of the present invention, the first, second, third, fourth, fifth, sixth, seventh, eighth, ninth and tenth embodiments are further modified so that the spherical optical recognition system is placed and held by gravity on three points of support (P, P', P'') of the positioning device (2), wherein one point of support is formed by a drive member (20, 21, 22) in contact with the external surface of the spherical object to rotate an object randomly in all directions on the positioning device. In accordance with a twelfth embodiment of the present invention, the eleventh embodiment is modified so that the drive member (20) of the optical recognition system is a wheel (21) that comes into contact with the external surface of the spherical object to drive an object in rotation, the rotating axle of the wheel is mounted at the end of a support (22) that can rotate along another axle, which passes through the point of contact of the wheel on the external surface of the spherical object and the centre of an object, so as to impose a random rotation on the spherical object via the wheel in all directions.

In accordance with a thirteenth embodiment of the present invention, the twelfth embodiment is modified so that the two points of support of the positioning device for the optical recognition system are each formed by a ball and socket joint (30, 40), wherein the ball (31) is placed to rotate freely in an end housing (32) of the ball and socket joint so that one portion of the ball emerges through an aperture in the housing to come into contact with the external surface of the spherical element (3). In accordance with a fourteenth embodiment of the present invention, the thirteenth embodiment is modified so that the portion of the ball and socket joint that houses the ball of the optical recognition system is a nozzle for bringing compressed air, so that the ball is held in the housing on an air cushion.

One advantage of the optical recognition system according to the invention lies in the fact that various figures or references are distributed, in a uniform manner, over the external surface of the object, which is preferably spherical. These figures are advantageously 4-bit encoded circular barcodes, with an additional external delimiting bit, which is for example black, on the external surface of the object, which is, for example, light-coloured (white). This enables the detection means, such as a digital camera, associated with the data processing station in which a position recognition algorithm is stored, to recognise each position of the object over time.

Advantageously, the positioning device, on which the spherical object is placed and held by gravity on three points of support, includes a drive member, which is formed by a wheel in contact with the external surface of the object, and a support for a drive wheel. The rotating axle of the wheel is mounted at the end of the support, which can rotate along another axle, which passes through the point of contact of the wheel on the external surface of the spherical object, and the centre of the spherical object. The support, which is rotatably mounted on a mechanical structure of the positioning device, and the drive wheel can be driven in rotation via compressed air means.

For the digital camera to be able to take a good image, an isotropic (uniform) lighting device is advantageously provided for the visible surface of the spherical object. A set of optical fibers guides the light provided by a distant light source to illuminate the object. The optical fiber set is separated into several sub-sets in proximity to the object. The ends of the optical fibers of one sub-set, which are for example 6 per sub-set, are fixed in a plastic stud secured to a lighting structure. 6 plastic studs preferably each holding 6 optical fiber ends are secured equidistant from each other on the lighting structure. This lighting structure is configured in the shape of a ring and placed just in front of the object on the digital camera side, without obstructing the digital camera's view of the object.

BRIEF DESCRIPTION OF THE DRAWINGS

The objects, advantages and features of the system for optical recognition of the position and/or movement of an object on a positioning device will appear more clearly in the following description, with reference to the drawings, in which:

FIGS. 3a and 3b show a partial cross-section lengthways and a top view of a ball and socket joint of the positioning device of the optical recognition system according to the invention, FIG. 4 shows an illustration of the spherical coordinates used to determine the position of the object as a spherical element on the positioning device of the optical recognition system according to the invention, FIG. 5 shows the position of the figures or references on the external surface of the spherical object for determining the position of the object on the positioning device of the optical recognition system according to the invention, and FIG. 6 shows a figure in the form of a circular barcode to be placed on the external surface of the spherical object to determine its position or orientation of the optical recognition system according to the invention.

DETAILED DESCRIPTION OF THE ILLUSTRATIVE EMBODIMENTS

In the following description, all of the elements of the system for optical recognition of the position and/or movement of an object on a positioning device, which are well known to those skilled in this technical field, will only be explained in a simplified manner. It should be noted that the optical recognition system could be used without limitations in various applications in which the precise position of an object, placed on a support or positioning device, has to be known. The object may also be a receiving antenna for picking up radio frequency signals, which must be precisely oriented on the positioning device. The object may also be a projector, a loudspeaker, an indicator, or any other electronic object or instrument. However, in the following description, reference will be made only to an optical recognition system that forms part of a radiation measuring system for the transmitting antenna of an electronic device.

Figure 1:
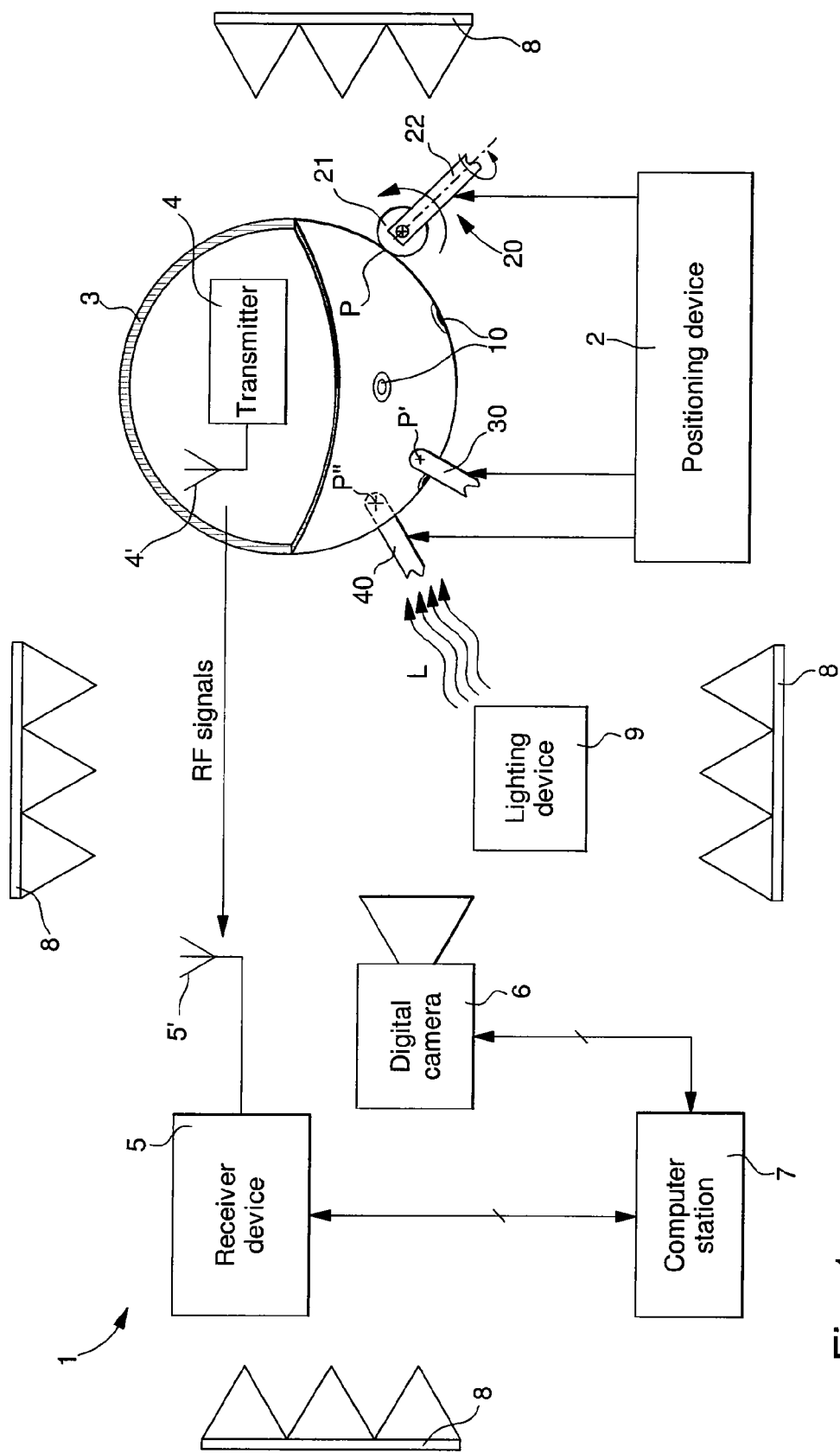
FIG. 1 shows, in a simplified manner, the various elements, which make up the optical recognition system according to the invention, which forms part of a radiation diagram measuring system of a transmitting antenna.

FIG. 1 illustrates schematically all of the elements of the optical recognition system of an object 3 on a positioning device 2, forming part of a radiation diagram measuring system 1 for the transmitting antenna 4' of an electronic transmitter device 4. Essentially, measuring system 1 includes, firstly, a positioning device 2, on which an object, configured as a spherical support element 3, for example for an electronic device, is placed and held, by gravity, on three support points P, P', P'' of members 20, 30, 40. An electronic device with transmitting antenna 4', which has to be measured, is held inside hollow spherical element 3, which includes two parts, which fit on top of each other, via any known means, to enclose the electronic device. Transmitting antenna 4' is preferably positioned close to the centre of the spherical element or hollow sphere.

The measuring system further includes a receiver device 5, provided with at least one receiving antenna 5' for picking up the electromagnetic field from transmitting antenna 4' (RF signals), means 6 for detecting the position or orientation of the spherical element that is moving on positioning device 2. The spherical element includes a certain number of figures or references 10, which are distributed over the external surface of the element, as explained below, and which are used for determining the position of the spherical element. The signals relating to the electromagnetic field picked up by the receiving antenna and position signals provided by the detecting means are transmitted, either automatically or upon demand, to a data processing station, which is preferably a computer station 7. Receiver device 5 and the detecting means, which are formed by a digital camera 6, can be electrically powered independently of the computer station or via a computer station.

The digital camera is preferably a black and white MOS camera with 768×1024 pixels, which is placed at a distance of around one or a few meters from the object. An acquisition card can be provided between the digital camera and the computer station to adapt the captured image signals to be transferred to the computer station. This digital camera card, in particular the card referenced PCI6229, is provided with a firewire connection, owing to a NI-IMAQ module for IEEE 1394 cameras, and it can generate or acquire digital or analogue signals.

For the sake of simplification in FIG. 1, positioning device 2 is represented only by members 20, 30, 40 that carry spherical element 3 for measuring the electromagnetic field generated by the transmitting antenna of the measuring system. This positioning device 2 thus includes a drive member 20, which is in contact with the external surface of the spherical element. This drive member is configured so that it rotates spherical element 3 randomly in every direction on the positioning device.

This drive member 20 is formed of a wheel 21, which comes into contact with the external surface of the spherical element to drive an element in rotation. The wheel can include a ring element made of rubber and arranged in a circular groove of a pulley for driving the spherical element without slipping. The rotating axle of wheel 21 is mounted at the end of a support 22 or rod. This support 22 is able to rotate along another axle passing through the point of contact P of the wheel on the external surface of the spherical element and the centre of an element. This means that a random rotation can be imposed on the spherical element via the wheel, in every direction. It takes an estimated time of 10 minutes for the spherical element to pass through every position. During this period of time, approximately 6,000 measurements can be made of the electromagnetic field, transmitted by the transmitting antenna.

Positioning device 2 also includes two ball and socket joints 30 and 40, explained below with reference to FIGS. 3a and 3b. Each ball in the ball and socket joints is arranged to come into contact with the external surface of spherical element 3. Thus, the contacts of wheel 21 and of ball of the two ball and socket joints 30, 40 form the three points of support P, P', P'', on which the spherical element rests. These three points of support can be regularly spaced to form the ends of an equilateral triangle preferably arranged horizontally. Of course, the centre of gravity of spherical element 3 must be in any position within the equilateral triangle in order to be held on the positioning device. The space between each support point must preferably be greater than the radius of the spherical element and less than 1.5 times the radius of a spherical element.

Instead of the three drive wheels of a prior art device, which formed the three points of support for the spherical element, the single drive wheel 21 no longer skids on contact with the external surface of the spherical element. This allows spherical element 3 to randomly describe the entire position space, with a high degree of homogeneity. This drive wheel is preferably driven by a motor or compressed air turbine, which is not shown, which is housed in the support in proximity to a wheel 21 or on the rotation axle of the wheel. At least one compressed air flexible pipe or tube is made in the support to circulate the compressed air from a compressed air tank towards the motor.

Another motor or compressed air turbine can be used for driving support 22 of drive wheel 21 in rotation. In such case, a set of pulleys and drive belts (not shown), between a motor and support 22 can impose the desired rotation on the support in order to make the rotating axle of the drive wheel rotate. With this single drive wheel, the spherical element no longer jumps on the three points of support. The only observed movement of the spherical element away from the centre is due to its natural out-of-roundness and the play of the bearings (pulleys) of the order of a millimeter. This could involve an angle calculation error of the order of 0.05 degrees in the measuring system, which is negligible.

FIGS. 3a and 3b show one of the ball and socket joints 30 of the positioning device to be used as one of the points of support for the spherical element. This ball and socket joint 30, which can be of generally cylindrical external shape, includes a housing 32 for a synthetic ball. The housing is sized such that the ball is free to rotate inside the housing. The housing may be spherical or cylindrical. Preferably, the ball and socket joint is made of a non-conductive material with a low friction coefficient, such as Teflon, for the freely rotating ball.

One portion of ball 31 emerges from housing 32 via a top aperture in ball and socket joint 30 to come into contact with the external surface of the spherical element. A force F, representing one part of the weight of the spherical element, is applied to point of support P' on the ball. The diameter of this aperture is smaller than the diameter of the ball, so that the ball is held inside housing 32.

For a housing of spherical shape, the ball and socket joint includes two parts that fit onto each other lengthways to trap the ball in the housing. In the case of a cylindrical housing, however, the top aperture is made in a cover (not shown), which partially closes the housing. The ball and socket joint is also configured in the form of a nozzle, to bring compressed air, via a pipe 33 in the ball and socket joint, right into the ball housing 32. Thus, the ball is held in its housing on an air cushion.

If spherical element 3 is placed only on two compressed air nozzles, whose flow is regulated, whereas the third point of support is the drive wheel, it is easy to make the spherical element float and rotate. However, in some cases, an oscillating movement animates the spherical element. The element moves closer to a nozzle, which increases the air pressure and ejects it slightly. If the local pressure, and thus the supporting force, decreases, the spherical element falls back onto the nozzle, which then ejects it again. Consequently, with compressed air nozzles, the air pressure has to be regulated in accordance with the weight of the sphere, which is resolved by the ball and socket joints according to the invention. A thread of compressed air comes out of the housing aperture around the ball, whose pressure depends upon the weight of the spherical element, which avoids the problems of simple compressed air nozzles. The spherical element can be driven freely in rotation without surges in every direction.

In order to overcome any problem linked to lack of balance of the spherical element on the three points of support, the weight of the spherical element can be increased by introducing an additional ball and socket joint, or a pressure spherical joint to the tip of the sphere. This ball and socket joint can be made using a ball that slides in a compressed air tube and generates a constant force on the spherical element, like a spring. The resultant of this normal pressure in contact with the drive wheel enables a wheel to adhere better.

Most of the components of the measuring system with digital camera are placed inside an anechoic chamber, illustrated by the elements referenced 8 in FIG. 1. This prevents any reflection of the electromagnetic field generated by transmitting antenna 4' onto obstacles that might be detrimental to the transmitting antenna radiation measurement. Moreover, none of the parts of the positioning device 2 in proximity to the transmitting antenna, i.e. inside a chamber, must be made of metal material, so that they do not interfere with measurement of the electromagnetic field generated by the transmitting antenna 4'. The drive means for positioning device 2, which are made of plastic or of a non-conductive material, operate using compressed air. These drive means may be motors or compressed air turbines, connected by pipes with taps to a compressed air tank. These non-metal motors for driving the wheel and wheel support along two axles, can thus be placed in proximity to the transmitting antenna.

In order to determine precisely the position or orientation of spherical element 3, and thus the transmitting antenna 4' that it contains and which has to be measured, specific figures or references 10 are placed on the external surface of spherical element 3. These figures and references are formed by circular barcodes, with each circular barcode defining a precise position of the spherical element on the positioning device. Each circular barcode 10 can be printed or bonded onto the external surface of the sphere or made by any other means.

There are, for example, 14 different circular barcodes of identical diameter, which are uniformly distributed over the external surface of the spherical element, as explained below with reference to FIGS. 5 and 6. Each circular barcode is encoded in 4 bits, and one external delimiting bit of a different colour to the external surface of the spherical element. The external surface of the spherical element is preferably light coloured, for example white, whereas at least one additional external delimiting bit is dark coloured, for example, black.

In order to improve the images captured by the digital camera, which must be able to take, for example, 15 images per second, optical recognition system further includes an isotropic lighting device 9. This lighting device 9 is configured so as to provide light beams L in the direction of at least half of the external surface of spherical element 3 on the side of digital camera 6.

Figure 2:
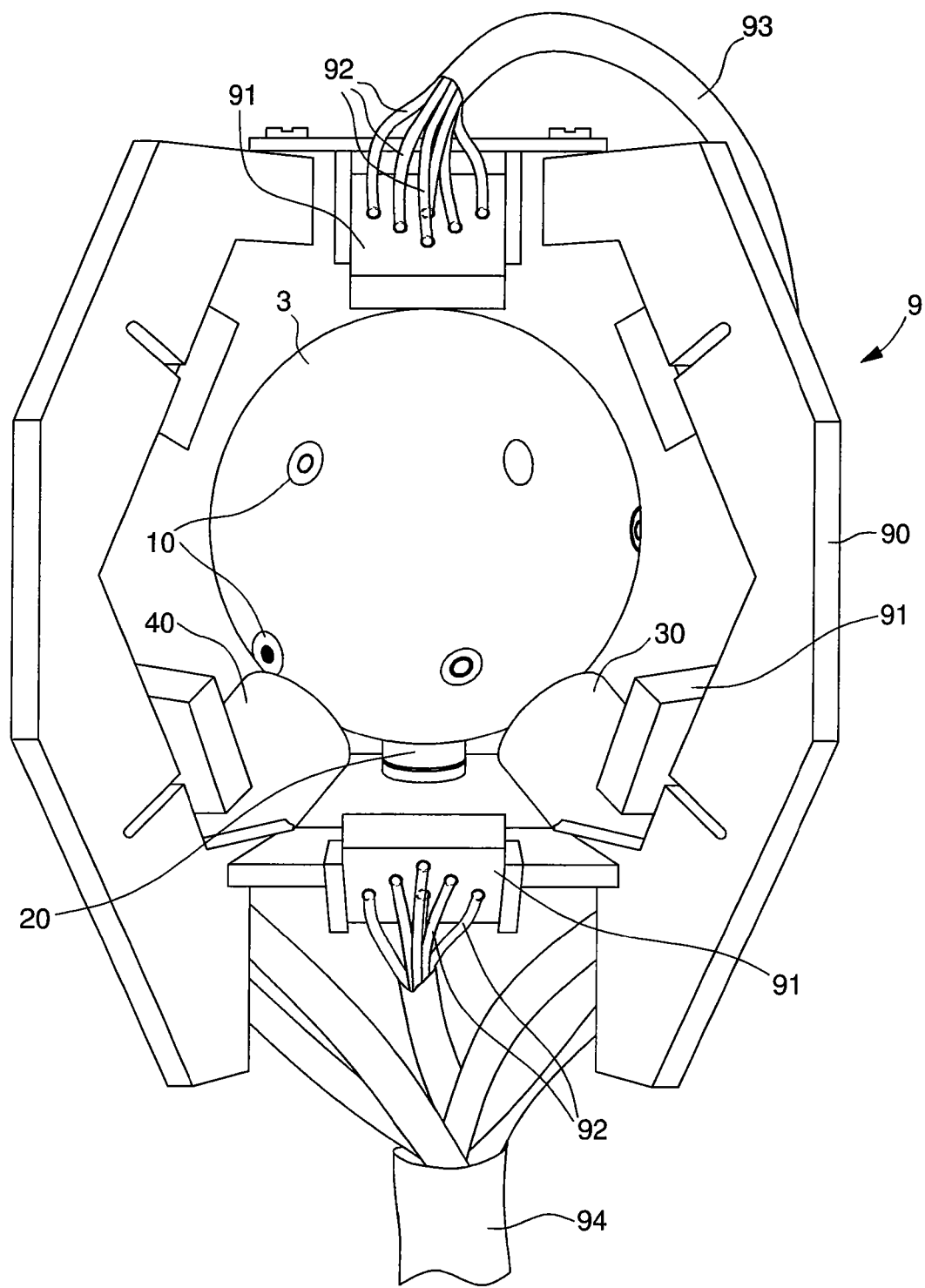
FIG. 2 shows one part of the lighting device for illuminating the object, which is defined as a spherical element, placed on the positioning device of the optical recognition system according to the invention.

Lighting device 9 of the spherical element or hollow sphere 3, which is provided with various circular barcodes, and which is placed on the three points of support of members 20, 30, 40 of the positioning device, is now explained with reference to FIG. 2.

It has been demonstrated that, for optical position recognition, the optical recognition system in a measuring system has a high level of sensitivity to lighting homogeneity. Previously, lighting via LED type light sources, arranged between absorption cones of the anechoic chamber, was used. However, it was observed that, when using 1 W LEDs, the power was insufficient to provide a good level of lighting. Moreover, the aperture angle of the LEDs is of the order of 110°, which requires the use of focussing lenses in front of the LEDs. What is more, securing and electrically powering the LEDs in the anechoic chamber raises a problem, because of the connection by a metal wire to each LED, which can be detrimental to the transmitting antenna radiation measurement.

For the lighting device according to the invention, a set of optical fibers 92 is used, wherein one end of each fiber is arranged in proximity to a light source (150 W) that is not shown, for receiving light. This light source is placed, for example, outside the anechoic chamber (not shown). This light source could be of the type used for coaxial microscope lighting. The set of optical fibers is grouped in a plastic sheath 94 to be directed into the anechoic chamber to a plastic lighting structure 90.

The optical fibers 92 used are preferably synthetic fibers wherein the end on the light source side is at a distance of, for example, 3.5 cm from the light source to prevent the fibers from burning. Because of their flexibility, these synthetic fibers are easy to handle. They can have a diameter of the order of 1 mm.

The set of optical fibers groups together 36 sufficiently long optical fibers (4 m) protected by the plastic outer sheath 94. The set of optical fibers is also divided into several sub-sets of optical fibers, protected by another plastic sheath 93, inside outer sheath 94, preferably 6 sub-sets of 6 optical fibers each protected by another sheath 93.

The ends of the optical fibers of each sub-set are secured in a square plastic stud, which has 3.5 cm sides and is 1 cm thick. The ends of optical fibers are arranged at equal distance from each other in each stud in the shape of equilateral triangles of 1.5 cm sides. 6 plastic studs 91 are regularly arranged on the periphery of the ring-shaped lighting structure 90. The ends of the optical fibers secured in the plastic studs of each sub-set are oriented so as to direct light beams in the direction of the centre of the spherical element. In this manner, the spherical element is lit in a homogenous manner, because of the optical fibers and the arrangement thereof in proximity to the spherical element, without the use of any metal material.

Ring-shaped lighting structure 90 is arranged between the digital camera and spherical element 3, but in proximity to the spherical element. It can be mechanically connected to the positioning device. The dimension of the lighting structure is slightly larger than the diameter of the spherical element, which may be of the order of 12 cm. The digital camera, which may be at a distance of one or two meters from the spherical element, must be able to observe the whole spherical element through lighting structure 90.

The way in which the optical recognition system according to the invention in a measuring system operates, to determine the transmitting antenna radiation diagram is described now with reference to FIGS. 4 to 6 below. It should first be noted that, in order to carry out all of the measuring operations, the transmitting antenna is always active so as to generate an electromagnetic field at a frequency, which may be of the order of the GHz. The electronic device with a transmitting antenna thus includes its own electric power source, such as a battery or rechargeable accumulator, given that it is enclosed in the spherical element. With this measuring system, one could measure the transmitting antenna of a portable telephone (GSM), for example, or any other apparatus that can be enclosed in a spherical element.

For the spherical element position measurements with the various circular barcodes that the spherical element includes on the outer surface thereof, the types of measurement are based on the Euler angles $\theta$, $\phi$, $\psi$, which define the elevation, azimuth and polarisation of the rotational planes. In mechanical applications, it is preferable to use the Euler angles to determine the position of a solid, such as the spherical element.

One point P, located in a three-dimensional space, is generally expressed by three coordinates P (x,y,z). These coordinates depend upon the type of coordinates selected (or referential). The Cartesian referential includes 3 orthonormal vectors x, y, z. Depending upon the type of application, the referential used changes to facilitate calculations or display.

The position of an object or of an antenna in space is characterized by 6 values. The first 3 values are none other than the coordinates of its centre of gravity. The other 3 values are the 3 Euler angles $\theta$, $\phi$, $\psi$, (elevation, azimuth and polarisation of the rotational planes), of which only two angles are indicated in FIG. 4.

The positioning device can place the spherical element, which contains the transmitting antenna to be measured, in any position or orientation, i.e. in the entire space of the three Euler angles (elevation $\theta$, azimuth $\phi$, and $\psi$ polarisation).

For calculating rotation in three-dimensional space, it should first of all be pointed out that the digital camera generates a spherical deformation of the image being observed, in particular of the spherical element or hollow sphere on the positioning device. For a distance between the camera and the spherical element of more than 1 m, the error is less than 0.2%.

Ignoring the above developed spherical deformation, it easily becomes possible to calculate the $3^{rd}$ coordinate (as y, z have been measured, x is determined by the equation $x=(r^2-y^2-z^2)^{1/2}$). Rotation at the three Euler angles is a transformation called a base change. The mathematical resolution of this transformation requires three equations, namely one equation per reference vector. However, rotation is an isometric transformation, which has the feature of maintaining angles. In the case of the spherical element of the invention, measuring two transformed vectors is sufficient to determine the base change completely, since the third unknown is contained in the aforecited isometric feature. An extremely simple and efficient way of resolving the system is to construct a third vector by the vectorial product of the two first vectors and to include it in a matrix resolution system.

It will be noted that the reverse matrix associated with each pair of vectors can easily be pre-calculated and stored in the memory of the computer station prior to the measuring phase, in order to decrease the processor load and increase the power available for recognising shapes or circular barcodes. The matrix R thus calculated contains values that have already been transformed by conventional trigonometric functions.

The number of points covered on the spherical element is indicated during the measurement. Objective data as to the progression of the measurements is thus obtained. This analysis is based on the rotation matrix. Once calculated we have the three Euler angles. Considering $\theta$ and $\phi$, and based on the FIG. 4 diagram of the spherical coordinates, this means looking to see whether the point P covers all of the points on sphere $S^2$. This is the same as observing whether ($\theta$, $\phi$) cover all of the points of the rectangle $R=[0, \pi]\times[-\pi, \pi]$ where $\theta$ is the longitude of P and $\phi$ is the latitude of P. The North and South Poles of $S^2$ are singular points for the spherical coordinates. Some precautions must therefore be taken in calculating $\theta$ and $\phi$.

As regards recognition of the position or orientation of the spherical element on the positioning device, an MOS black and white digital camera with 768×1024 pixels is used. This camera takes 15 images per second and supplies a corresponding exposure signal to the computer station, which includes stored, recognition software that is quick and accurate. As the camera is a black and white camera, it is therefore possible to work on the shapes of the figures, which are preferably circular barcodes 10.

The dimensions of the figures selected (circular barcodes) do not exceed 12 mm, which represents $1/10^{th}$ of the diameter of the spherical element. When the spherical element fills the image captured by the camera, there are 768 pixels over 12 cm, i.e. 76.8 pixels per figure (12 mm), which is sufficient. Given the shape of the spherical element, circular barcodes are preferably used to cover the external surface of the spherical element. If the convexity of the spherical element is ignored, projection onto a tangent plane transforms the circles into ellipses. The centre of a circle is thus transformed into the centre of an ellipse, whose position thus exactly defines that of the circle of the circular barcode figure.

It should be noted that the digital camera, in collaboration with the computer station, is also able to detect a curvilinear movement or movement of translation by the spherical element, by controlling the variation in position and space between two barcodes that are visible to the camera. A rotational or translation speed can also be determined using the various figures placed on the spherical element.

In order to see properly more than 2 circular barcodes in the image captured by the camera, 14 circular barcodes are distributed over the spherical element as follows: 2 for each Pole, 4 for the Equator, 4 for each hemisphere as shown partially in FIG. 5. Each figure 10 located in the hemispheres is equidistant from the Pole and from two figures on the Equator.

4 bits are thus used to encode 14 figures (circular barcodes), and one external delimiting bit that is always black, and which defines the edge of the figure as shown in FIG. 6. The centre of each circular barcode defines the less significant bit (LSB), whereas the external bit defines the more significant bit (MSB). Each bit in state 1 is black, whereas each bit in state 0 is light-coloured, in particular white. With 12 mm diameter patterns, there are approximately 7.68 pixels per encoding bar.

The table below shows the position of the figures on the external surface of the spherical element with the hexadecimal code and spherical position coordinates (in cm):

| Position | Hexadecimal code | Position in cartesian coordinates |
| --- | --- | --- |
| North Pole | 1 0 0 1 1 | (0, 0, 6) |
| South Pole | 1 0 1 1 1 | (0, 0, −6) |
| Equator | 1 0 0 0 0 | (6, 0, 0) |
|  | 1 1 1 0 0 | (0, 6, 0) |
|  | 1 0 0 1 0 | (−6, 0, 0) |
|  | 1 1 0 0 0 | (0, −6, 0) |
| North Hemis. | 1 0 1 0 0 | (3.46, 3.46, 3.46) |
|  | 1 1 0 1 1 | (−3.46, 3.46, 3.46) |
|  | 1 1 1 1 0 | (−3.46, −3.46, 3.46) |
|  | 1 0 1 1 0 | (3.46, −3.46, 3.46) |
| South Hemis. | 1 0 0 0 1 | (3.46, 3.46, −3.46) |
|  | 1 1 1 0 1 | (−3.46, 3.46, −3.46) |
|  | 1 0 1 0 1 | (−3.46, −3.46, −3.46) |
|  | 1 1 0 0 1 | (3.46, −3.46, −3.46) |

To calculate rotation in the computer station, the rotation matrix defines the rotation of the spherical element relative to an initial position on the positioning device. However, if the radiation diagram is being set up for the measuring system, the usually described rotation is that of the receiving antenna and thus that of the digital camera relative to the spherical element that contains the transmitting antenna being measured. This is thus the reverse rotation (that of the relative movement), referenced $R^{-1}$. Since R is an isometric transformation, $R^{-1}$ is directly equal to the transpose of R, referenced $R^T$. The $\theta$, $\phi$ and $\psi$ angle values then have to be reconstructed. This reconstruction is carried out by a procedure calling on the reverse trigonometric functions in a very precise order in order to clarify any possible undeterminations.

For processing the image captured by digital camera 6 shown in FIG. 1 in computer station 7, a calibration phase is first of all carried out to detect the centre of spherical element 3, and its radius is measured. Subsequently, two figures 10 (which are circular barcodes) of the image are recognised and their positions are calculated. Then an estimate is made of the calculation errors introduced.

To calibrate the optical recognition system, the radius and centre of the circle that passes through the contour of spherical element 3 is calculated. This operation determines a reference and decreases the image surface to be processed. Only one square area, with a radius of 0.95·side radius, and which is centred on the spherical element, is kept. Next, the image is digitised. The optimum threshold is determined by a statistical method.

For data processing by recognition software stored in the computer station, a programming loop calculates the position of the filmed spherical image. At each iteration, the image is analysed to determine the two visible figures closest to the centre and their pixel position. The Euler angles are then calculated and stored in a table. Finally, all of the measurements taken are saved.

The figure position detection algorithm (recognition software) requires a precise universal referential, to prevent a systematic error in the calculated positions. Two automatic detection algorithms have thus been developed, which are a thresholding method and an intercorrelation method.

The thresholding method is based on contour detection via thresholding. A rising edge is identified on segments placed in the arc of a circle on the top hemisphere of the spherical element. Once the points have been found, a least square algorithm interpoles the equation of the corresponding circle. When using this algorithm, it will be noted that the shadow on the edge of the spherical element due to the lack of lighting homogeneity, interferes with contour detection. A more robust algorithm is therefore necessary.

The intercorrelation method uses correlation of two images in order to find the coordinates of the circle delimiting the contour of the spherical element. The first image is that captured by digital camera 6. The second image shows a white disc, whose radius is known, centred on a black background. If the intercorrelation function is calculated, the maximum determines the centre of the spherical element. In order to find the radius, a calculation iteration is performed with a reference circle of variable radius.

For an image of 200×200 pixels, the calculation time is of the order of a second. It therefore takes a long time to perform on an image of 768×1024 pixels. Consequently, only some parts of the image are exploited. In the knowledge that 3 points are required to determine a circle, 3 zones are captured in the image.

On the basis of a function giving the maximum of the sum of the two-dimensional intercorrelation functions of the 3 zones, it is possible to detect the index of the column and line of the maximum and thus to calculate the position of the centre of the spherical element. The calculation is then iterated with images of variable radius. In order to do this, a geometric method is used. The calculation is iterated 4 times on a radius that varies from 280 to 380 by steps of 25. The two radii, with which the intercorrelation function is maximum, are identified for reiteration 5 times per step of 5 in the interval. A last iteration with steps of 1 determines the radius. This method avoids iterating on all the radii.

To correctly carry out the intercorrelation product of the two images, their continuous components have to be cancelled The means of the image elements is thus subtracted from the original image prior to the intercorrelation product. After several tests, it is observed that the radius found largely depends upon the value of the DC component. The continuous value over 256 levels has a value of 45.

For manual detection, it is noted that the results of the two algorithms described above greatly depend upon lighting and thus upon the DC component of the source image. This is why we have opted for manual calibration by the user and not automatic detection. The human eye can distinguish the contour of the spherical element almost perfectly and this prevents any wasteful error, which would distort all of the measurements.

We will now describe a figure position detection algorithm. Above all else, the limitations linked to recognition of the figures must be well defined. The lighting of the spherical element gives rise to a series of specular reflections that can locally destroy the contrast of figures 10 (circular barcodes), and generate errors as to the position and encoding of objects.

The exposure time of camera 6 generates a blur on the edge of the figures, for a given rotational speed and figure position. Taking one figure on the edge of the sphere and a rotational speed of 1 revolution per second, the blur for an exposure time of 10 ms is $\Delta d = 10 \text{ ms} \cdot (2\pi/1000) \cdot 0.06 \text{ m}$, which equals 4 mm. The exposure time eventually chosen is approximately 3 ms. Moreover, if one of the two figures is close to the centre and the other is at the periphery, and in the case of a polarisation rotation, the angle between the two figures may be distorted.

The actual position recognition uses two functions, which work on a binary image and use image-processing algorithms. As regards the figure type detection algorithm, once the position of the spherical element has been determined and the calculations of the centre, major axis and minor axis have been carried out, a figure recognition procedure can determine the figure 10 being observed. Once the figures have been defined, they are represented by their centre and 2 axes.

A first algorithm processes the detected figure so as to select the most representative half major axis. Since the reflections generally appear in the form of less contrast and greater luminosity, the mean luminosity along the two half major axes is compared, and the lowest value is selected. Since a full black circle is a prohibited pattern, a second algorithm extracts the image line along the selected half major axis and then removes the continuous level by subtracting the mean value. A third algorithm multiplies and totals the profile obtained above with 14 vectors representing the 14 figures. The size of these vectors, and that of the half major axis is directly deducted, by calculating from the spherical element radius obtained during the calibration phase. The figure is determined by the maximum of the 14 multiplications-products.

The size of the source vector varies in accordance with the position of the figure on the spherical element, smaller in the edges. The vector size is thus not always equal. Assuming that the source vector size has a value N, rather than removing elements from the vector, which would cause a phase shift, the elements of the source vector are repeated 5 times (dimension=5·N). The sizes of the vectors are thus equal and the algorithm can work.

The θ-φ graph of calculated positions is continuously displayed on the computer station screen. The captured image could also be displayed in real time, with the figures delimited by a rectangle. This allows the detected figures to be easily observed. A cube, whose movement corresponds to that of the spherical element, could also be displayed. The display is updated for each image. In the event of error, the last correct position is kept.

One way of checking whether the calculated rotation is correct is to calculate the difference in angle between two successive rotations. The distance is calculated between two successive rotations of one point on a sphere of radius 1. If this distance is greater than a particular threshold, there is an error.

From the description that has just been given, those skilled in the art can devise multiple variants of the system for optical recognition of the position and/or movement of an object on a positioning device, without departing from the scope of the invention, as defined by the claims. The detection means can be arranged on the positioning device, which could be controlled via the computer station. The object arranged on the positioning device might be a cylindrical or ovoid element with the circular barcodes distributed over the external surface of the object. The colour of the external surface of the object can be dark, for example, black, whereas the colour of the figures may be light, for example, white.

The invention claimed is:

1. A system for optical recognition of the position and movement of an object on a positioning device, which includes a drive member for driving the object in rotation or along a curvilinear or rectilinear path, the system including a digital camera for detecting the position or orientation of the object, and a data processing station for data supplied by the digital camera, a certain number of different figures or references being distributed over the external surface of the object, the arrangement of each figure on the external surface of the object enabling the digital camera, associated with the data processing station, to determine the position or orientation of the object on the positioning device, wherein the object is a spherical support element for an electronic device, and wherein the figures or references are formed by circular barcodes which are different from each other, and which are regularly spaced and uniformly distributed on the external surface of the spherical element, each circular barcode defining a precise position of the spherical element on the positioning device.

2. The optical recognition system according to claim 1, wherein 14 different circular barcodes are distributed at regular intervals over the external surface of the spherical object, each circular barcode, which includes a series of concentric rings, being encoded in 4 bits, wherein the state of each annular bit is defined by a colour that is identical to or different from the colour of the external surface of the spherical element, in addition to an external delimiting bit, which is a different colour from the colour of the external surface of the spherical element to define the edge of each figure.

3. The optical recognition system according to claim 2, wherein the dimension of each circular barcode is $1/10^{th}$ of the diameter of the spherical object.

4. The optical recognition system according to claim 1, wherein the object is a hollow spherical element, which is formed of two parts that fit one on top of the other to enclose the electronic device.

5. The optical recognition system according to claim 1, wherein the external surface of the object is light-coloured, whereas each figure is dark-coloured.

6. The optical recognition system according to claim 1, wherein the digital camera is a black and white MOS camera with 768×1024 pixels able to take more than 10 images per second.

7. The optical recognition system according to claim 1, wherein it includes a lighting device for lighting, in a uniform manner, the external surface of the spherical object that is visible to the digital camera.

8. The optical recognition system according to claim 7, wherein the lighting device includes a set of optical fibers guiding light generated by a light source that is distant from the spherical element, to provide a homogenous light beam to improve the image captured by the digital camera of the spherical object, with the various visible figures.

9. The optical recognition system according to claim 8, wherein the set of optical fibers is divided into several sub-sets of optical fibers, wherein the ends of the optical fibers of each sub-set in proximity to the spherical element are secured in plastic studs on a lighting structure, wherein the lighting structure forms a ring, on which several plastic studs, are arranged for the optical fiber ends of the sub-sets, over the entire periphery of the ring and equidistant from each other, the ring being placed in front of the spherical object on the side of the digital camera, without obstructing the digital camera's view of the object, and wherein the ends of the optical fibers of each sub-set are oriented so as to direct light beams in the direction of the centre of the spherical object.

10. The optical recognition system according to claim 8, wherein the number of optical fibers per sub-set is at least two optical fibers, and preferably 6 optical fibers, whose ends, which are secured in one of the plastic studs, which are equidistant from each other, are arranged in the form of equilateral triangles.

11. The optical recognition system according to claim 1, wherein the spherical object is placed and held by gravity on three points of support of the positioning device, wherein one point of support is formed by the drive member in contact with the external surface of the spherical object to rotate said object randomly in all directions on the positioning device.

12. The optical recognition system according to claim 11, wherein the drive member is a wheel that comes into contact with the external surface of the spherical object to drive said object in rotation, the rotating axle of the wheel is mounted at the end of a support that can rotate along another axle, which passes through the point of contact of the wheel on the external surface of the spherical object and the centre of said object, so as to impose a random rotation on the spherical object via the wheel in all directions.

13. The optical recognition system according to claim 12, wherein the other two points of support of the positioning device are each formed by a ball and socket joint, wherein the ball is placed to rotate freely in an end housing of the ball and socket joint so that one portion of the ball emerges through an aperture in the housing to come into contact with the external surface of the spherical element.

14. The optical recognition system, according to claim 13, wherein the portion of the ball and socket joint that houses the ball is a nozzle for bringing compressed air, so that the ball is held in the housing on an air cushion.

15. The optical recognition system according to claim 9, wherein the number of optical fibers per sub-set is at least two optical fibers, whose ends, which are secured in one of the plastic studs, which are equidistant from each other, are arranged in the form of equilateral triangles.

16. The optical recognition system according to claim 9, wherein the number of optical fibers per sub-set is 6 optical fibers.

17. The optical recognition system according to claim 5, wherein the external surface of the object is white, whereas each figure is black.

* * * * *